(12) United States Patent
Kada

(10) Patent No.: US 6,398,098 B1
(45) Date of Patent: Jun. 4, 2002

(54) WIRE BONDING HEAD INVOLVING MINIMIZED TIP SKID

(75) Inventor: Takeo Kada, Tokyo (JP)

(73) Assignee: Ultrasonic Engineering Co., Ltd. (JP)

( * ) Notice: Subject to any disclaimer, the term of this patent is extended or adjusted under 35 U.S.C. 154(b) by 7 days.

(21) Appl. No.: 09/709,164

(22) Filed: Nov. 8, 2000

(30) Foreign Application Priority Data

Nov. 12, 1999 (JP) .......................................... 11-359649

(51) Int. Cl.[7] .......................... B23K 37/02; B23K 31/02
(52) U.S. Cl. ....................... 228/4.5; 228/1.1; 228/180.5
(58) Field of Search ........................... 228/110.1, 179.1, 228/180.5, 1.1, 4.5, 904, 112.1; 156/580.1, 73.1, 73.2

(56) References Cited

U.S. PATENT DOCUMENTS

| | | | | |
|---|---|---|---|---|
| 3,384,283 A | * | 5/1968 | Mims ............................. | 228/1 |
| 3,601,304 A | * | 8/1971 | Mansour ........................ | 228/1 |
| 5,156,320 A | * | 10/1992 | Yanagida ..................... | 228/102 |
| 5,894,983 A | * | 4/1999 | Beck et al. .............. | 228/110.1 |
| 5,931,372 A | * | 8/1999 | Miller ....................... | 228/180.5 |
| 5,979,737 A | * | 11/1999 | Farassat ....................... | 228/1.1 |
| 6,282,780 B1 | * | 9/2001 | Waki et al. .................... | 29/840 |

* cited by examiner

*Primary Examiner*—M. Alexandra Elve
*Assistant Examiner*—Len Tran

(57) ABSTRACT

In a wire bonding head, a transducer block depends from a carriage block via a special link mechanism including a main link member pivotally attached to the carriage block at its one end and to the transducer block at its other end so that the bonding tool tip may move along a vertical and linear path without any lateral displacement as the transducer block moves toward and away from the carriage block. Because the carriage block essentially undergoes a pivotal motion around the pivot on the carriage block, the effective inertia of the transducer block is kept small as compared to the case where a translational motion is caused to the transducer block. The structure according to the present invention is relatively simple and low in cost, and can be made free from plays particularly when the pivots consist of spring pivots using flexures.

16 Claims, 3 Drawing Sheets

US 6,398,098 B1

WIRE BONDING HEAD INVOLVING MINIMIZED TIP SKID

TECHNICAL FIELD

The present invention relates to a wire bonding machine that can be used or assembling semiconductor devices and a wide range of electric and electronic components, and in particular to a bonding head which is suitable for use in high speed wire bonding machines and single-point TAB bonding machines.

BACKGROUND OF THE INVENTION

The bonding head of a wire bonding machine generally comprises a carriage block which is adapted to be moved both laterally and vertically so as to be moved to a desired location over the work piece such as a semiconductor device or circuit board, and a transducer block which carries a bonding tool and is supported by the carriage block so as to selectively apply the bonding tool onto a desired point on the work piece. When applying the bonding tool onto a desired point on the work piece, it is desirable to move the bonding tool vertically without involving any lateral movement as much as possible. The lateral motion of the bonding tool as it engages a work piece is called as "tip skid", and could impair the bonding quality.

FIG. 6 shows a conventional wire bonding head comprising a horizontally extending transducer block 1 which is pivotally attached to a carriage block 2 at its base end via a horizontal pivot 3. The transducer block 1 comprises a tool holder 4 incorporating a transducer (not shown in the drawing) for converting electric energy into ultrasonic vibration energy, a horn 5 extending from the free end of the holder 4 and functionally connected to the transducer, and a vertically extending bonding tool 6 attached to the free end of the horn 5 by a tool set screw 8. The bonding tool 6 engages a work piece at its tip 7 to accomplish the known ultrasonic bonding process.

The base end of the transducer block 1 is provided with a vertical arm 1b which engages a stopper 10 provided in the carriage block 2 to define the limit of the downward pivotal movement of the transducer block 1 around the pivot 3. A linear motor 9 is provided between an intermediate part of the vertical arm 1b and the carriage block 2 to actuate the pivotal movement of the transducer block 1 around the pivot 3.

The lateral movement of the tip 7 of the bonding tool 6 or tip skid can be minimized by selecting the position of the pivot 3 at a substantially same vertical level as the bonding tool tip 7, and increasing the distance between the pivot 3 and the bonding tool tip 7. Therefore, the transducer block 1 typically consists of an elongated arm extending horizontally. This arrangement has the advantage of simplicity.

However, according to this arrangement, because the position of the pivotal joint (pivot 3) between the transducer block 1 and the carriage block 2 is relatively low, it is difficult to avoid the interference between the pivotal joint and the work piece. Therefore, the area of the work piece that can be covered by the bonding head may be limited, and the restriction on the size and shape of the pivotal joint puts a severe restriction on the design of the bonding head.

It is also possible to use a pair of parallel sheet springs to support the transducer block on the carriage block. The parallel sheet springs enable the transducer block to move linearly, and the bonding tool tip may be guided so as to move vertically substantially without any lateral movement.

In this case, the parallel sheet springs serving as the pivotal joint between the transducer block and the carriage block may be provided at a certain height, and the interference with the pivotal joint and the work piece can be avoided.

However, this arrangement increases the complexity of the bonding head. More importantly, as the transducer block moves vertically, it involves a significant inertia because the transducer undergoes a purely translational motion instead of a pivotal movement. The bonding tool is required to engage onto and disengage from the work piece at high speed, and the large inertia of the transducer block tends to cause a severe impact on the work piece. Such a large impact causes an excessive-plastic deformation of the work piece, and this tends to impair the bonding quality. It is thus desired to minimize the effective mass of the transducer block as much as possible, particularly when the speed of the movement of the bonding tool is desired to be maximized.

BRIEF SUMMARY OF THE INVENTION

In view of such problems of the prior art, a primary object of the present invention is to provide a wire bonding head which allows the bonding tool tip to move vertically substantially without any lateral movement so as to achieve a high bonding quality.

A second object of the present invention is to provide a wire bonding head which can minimize the effective inertia of its transducer block, and can thereby achieve a high bonding quality.

A third object of the present invention is to provided a wire bonding head which can minimize the effective inertia of its transducer block, and can thereby operate at high speed.

A fourth object of the present invention is to provided a wire bonding head which is simple in structure, and is relatively free from plays.

According to the present invention, these objects can be accomplished by providing a wire bonding head, comprising: a carriage block adapted to be moved to a desired location over a work piece, and having a first end and a second end which is laterally displaced from the first end; a main link member having a first end pivotally attached to the first end of the carriage block via a first pivot having a pivot axis extending substantially horizontally and perpendicularly with respect to a line extending between the first and second ends of the carriage block; a transducer block having a first end carrying a bonding tool and a second end which is laterally displaced from the first end of the transducer block, a second end of the main link member being pivotally connected to the transducer block via a second pivot having a pivot axis extending in parallel with the pivot axis of the first pivot and, preferably, substantially through a gravitational center of the transducer block; an actuator for selectively causing an angular movement to the main link member around the first pivot; and a coupling joint connected between the second end of the carriage block and the second end of the transducer block which is constrained so as to create a lateral movement of the second end of the transducer block that is required to move a bonding tool tip vertically and linearly as the transducer block is moved vertically relative to the carriage block by the main link member via the second pivot.

The bonding tool tip is thus enabled to move along a vertical and linear path as the transducer block moves toward and away from the carriage block. Because the carriage block essentially undergoes a pivotal motion around the first pivot, the effective inertia of the transducer block is kept small as compared to the case of causing a translational motion to the transducer block. The structure according to the present invention is relatively simple and low in cost, and can be made free from plays particularly when the pivots consist of spring pivots using flexures.

According to a preferred embodiment of the present invention, the coupling joint comprises a substantially vertically extending secondary link member having a first end pivotally connected to the second end of the transducer block via a third pivot, and a second end pivotally connected to the second end of the carriage block via a fourth pivot. Also, the first pivot and bonding tool tip are preferably located at a substantially same lateral position, and the first and third pins are preferably located at a substantially same height.

Alternatively, the coupling joint may comprise a slider guided horizontally along the second end of the carriage block, and an arm extending from the second end of the transducer block and having a free end pivotally attached to the slider via a slider pivot. Preferably, the slider pivot is located at a substantially same height as the first pivot, and the second pivot is located at a mid point in a line extending between the bonding tool tip and the slider pivot. Preferably, the first pivot and bonding tool tip are located symmetric with respect to a horizontal line passing through the second pivot so as to form the Scott-Russel link mechanism.

A wide range of actuators can be used for producing a relative movement between the carriage block and the transducer block. According to a preferred embodiment, the actuator consists of a linear motor interposed between the main link member and the carriage block.

To achievie a same goal, the coupling joint may also be connected between the carriage block, the main link member and the transducer block, the coupling joint being constrained so as to cause a rotation of the transducer block by a substantially same but opposite rotational angle as that of the main link member with respect to the carriage block. In this case, the coupling joint preferably comprises a pair of fixed gears fixedly attached to the transducer block and carriage block, respectively, and a third gear rotatably supported by the main link member and meshing with both of the fixed gears, the gear fixed to the carriage block having a radius twice that of the gear fixed to the transducer block.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
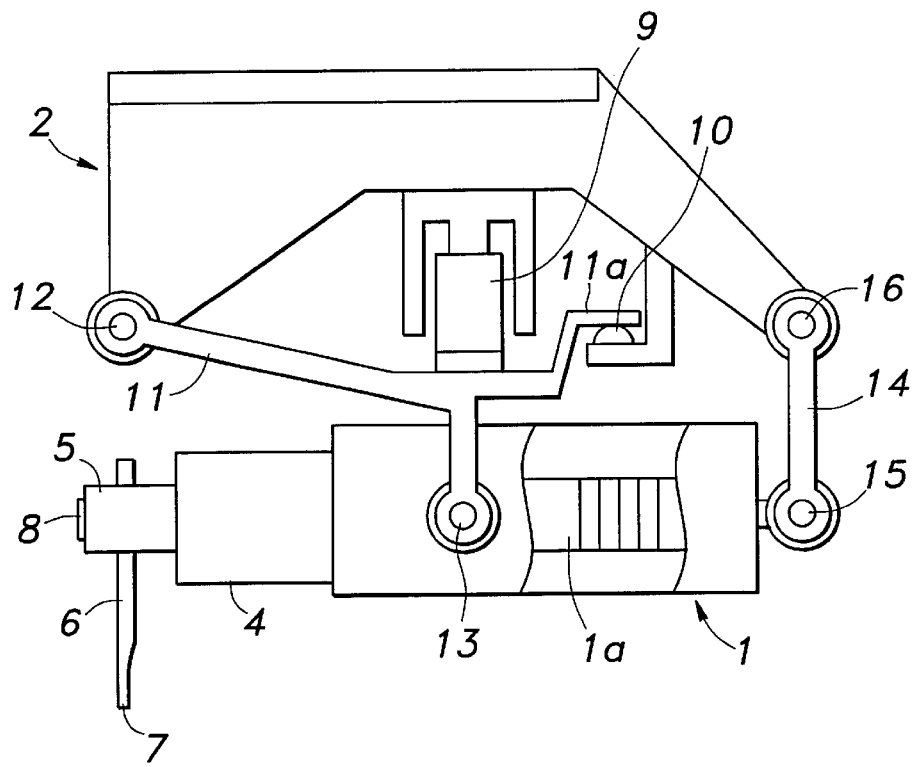
FIG. 1 is a schematic side view of a wire bonding head embodying the present invention.

FIG. 1 shows a wire bonding head given as a first embodiment of the present invention. This comprises a transducer block 1 which depends from a carriage block 2 via a main link member 11. One end of the main link member 11 is pivotally connected to a first end (left end in FIG. 1) of the carriage block 1 via a first pivot 12 having a horizontally extending pivot axis. The other end of the main link member 11 is pivotally attached to a middle point of the transducer block 2 via a second pivot 13 extending in parallel with the first pivot 12 and having a pivot axis substantially passing through a gravitational center of the transducer block 1. The main link member 11 is provided with an extension 11a extending away from an intermediate point of the main link member 11 away from the one end thereof, and adapted to cooperate with a stopper 10 formed in the carriage block 2 to define the lower limit of the vertical rotational motion of the main link member 11 around the first pivot 12.

A substantially vertically extending secondary link member 14 extends between a second end (right end in FIG. 1) of the carriage block 2 and a second end (right end in FIG. 1) of the transducer block 1 with one end of the secondary link member 14 pivotally connected to the transducer block 2 via a third pivot 15 and the other end of the link member 14 pivotally connected to the carriage block 2 via the a fourth pivot 16. These pivots 15 and 16 both extend in parallel with the first and second pivots 12 and 13.

The transducer block 1 carries a transducer 1a, a tool holder 4 connected to the transducer 1a, a horn 5 extending from the free end of the tool holder 4, and a vertically extending bonding tool 6 attached to the free end of the horn 5 by a tool set screw 8. The bonding tool 6 engages a work piece at its tip 7 to accomplish the known ultrasonic bonding process, and is located at a substantially same lateral location as the pivot axis of the first pivot 12.

Typically, the first and fourth pivots 12 and 16 are located on a common horizontal level, and the second and third pivots 13 and 15 are located on another lower common horizontal level. The bonding tool tip 7 has a same lateral position as the first pivot 12. The second pivot 13 is on a mid point of a line extending between the fourth pivot 16 and the bonding tool tip 7, and the distance between the first pivot 12 and the second pivot 13 is one half the distance between the bonding tool tip 7 and the fourth pivot 16. This geometrical relationship provides a highly simple embodiment, and a similar practical advantage can be gained by various modifications from this embodiment.

A linear motor 9 is provided between an intermediate part of the main link member 11 and the carriage block 2 to actuate the pivotal movement of the main link member 11 around the first pivot 12. The linear motor 9 comprises a permanent magnet attached to the carriage block 2 and a coil attached to the link member 11 so as to cooperate with the permanent magnet. By conducting electric current through the coil, the permanent magnet is actuated accordingly, and the link member 11 is actuated in relation with the carriage block. The electric current is controlled in such a manner that the main link member 11 may be firmly engaged by the stopper 10 during the time the main link member 11 is moving upward or downward at high speed, and a required pressure may be applied to the bonding tool tip 7 when the bonding tool 6 has landed on a work piece or a bonding process is being carried out. The force by which the main link member 11 engages the stopper 10 is called "holding load", and the force by which the bonding tool tip 7 is pressed onto the work piece is called as "bonding load".

In the case of a wire bonding machine using a 30 μm diameter aluminum wire, the holding load is typically in the order of 1.5 N when converted into the load acting on the bonding tool tip, and the bonding load is typically in the range of 0.3 to 0.4 N.

The carriage block 2 is attached to the main body of the bonding machine via a vertical and rotary movement mechanism which is not shown in he drawings. As the bonding tool tip 7 lands on the work piece as a result of the downward movement of the carriage block 2, a sensor associated with the stopper 10 detects the disengagement of the main link member 11 away from the stopper 10, and any further downward movement of the carriage block 2 is controlled.

Figure 2:
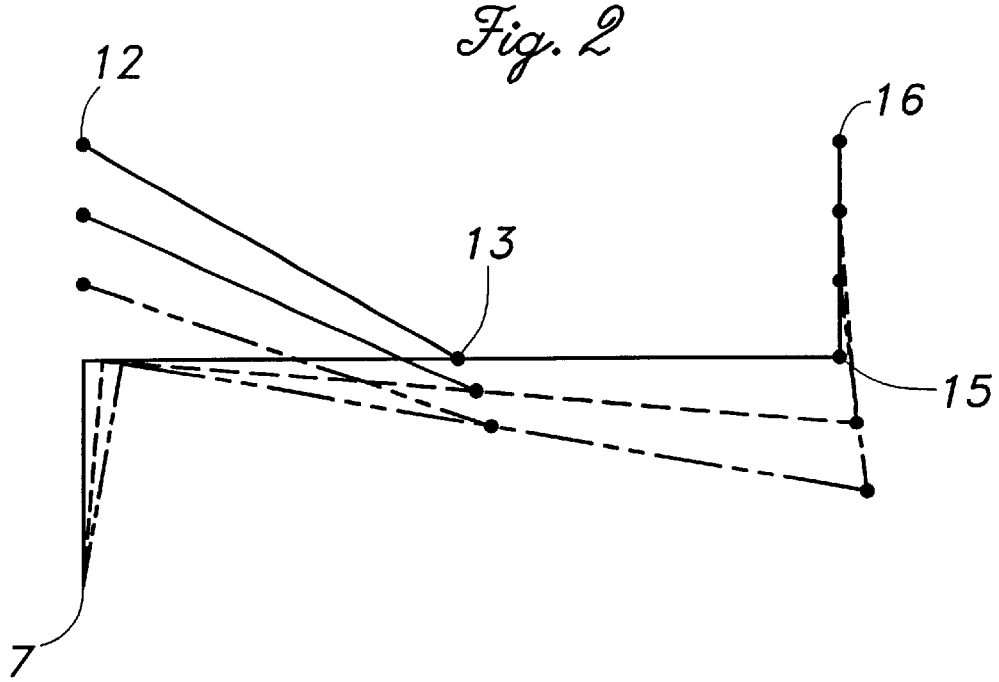
FIG. 2 is a skeleton diagram of the first embodiment shown in FIG. 1 showing the movement of various parts as the carriage head continues its descent after the bonding tool has landed on a work piece.

FIG. 2 is a skeleton diagram showing the movement of the main link member 11, secondary link member 14, transducer block 1 and bonding tool 6 when the bonding tool tip 7 has landed on a work piece but the carriage block 2 continues a downward movement. As a result, the transducer block 1 tilts around the bonding tool tip 7 in clockwise direction as seen in FIG. 2. The tilting motion of the transducer block 1 causes a rightward pivoting movement of the secondary link member 14 around the fourth pivot 16. This accommodates the arcuate motion of the third pivot 15 around the bonding tool tip 7 via an outward pivotal motion of the secondary link member 14 around the fourth pivot 16. Thus, the downward movement of the carriage block 2 following the landing of the bonding tool tip 7 on the work piece causes a simple pivoting of the transducer block 1 around the bonding tool tip 7 without any skidding of the bonding tool tip 7.

Figure 3:
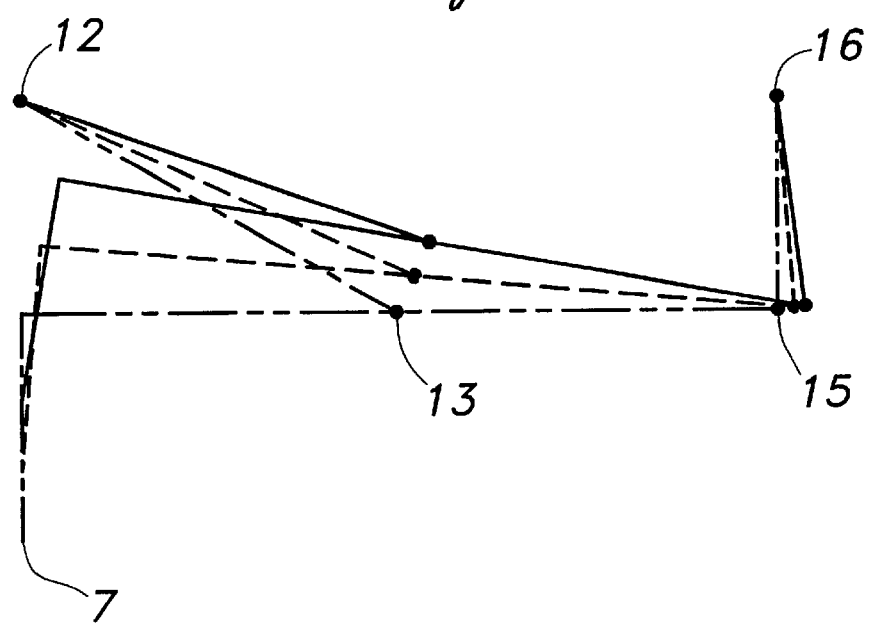
FIG. 3 is a skeleton diagram of the first embodiment shown in FIG. 1 showing the movement of various parts as the bonding tool tip moves downward as the bonding process progresses while the carriage head remains stationary.

FIG. 3 is a skeleton diagram showing the movement of the main link member 11, secondary link member 14, transducer block 1 and bonding tool 6 when the carriage block 2 has ceased the downward movement, and the bonding tool tip 7 moves downward as the bonding process progresses and the work piece collapses by undergoing a plastic deformation. The transducer block 1 tilts in clockwise direction as the bonding tool tip 7 moves downward as a result of the collapsing of the work piece. The tilting motion of the transducer block 1 causes a leftward or inward pivoting of the secondary link member 14. This allows the bonding tool tip 7 to descend downward substantially without any lateral movement. This ensures a favorable bonding result.

Figure 6:
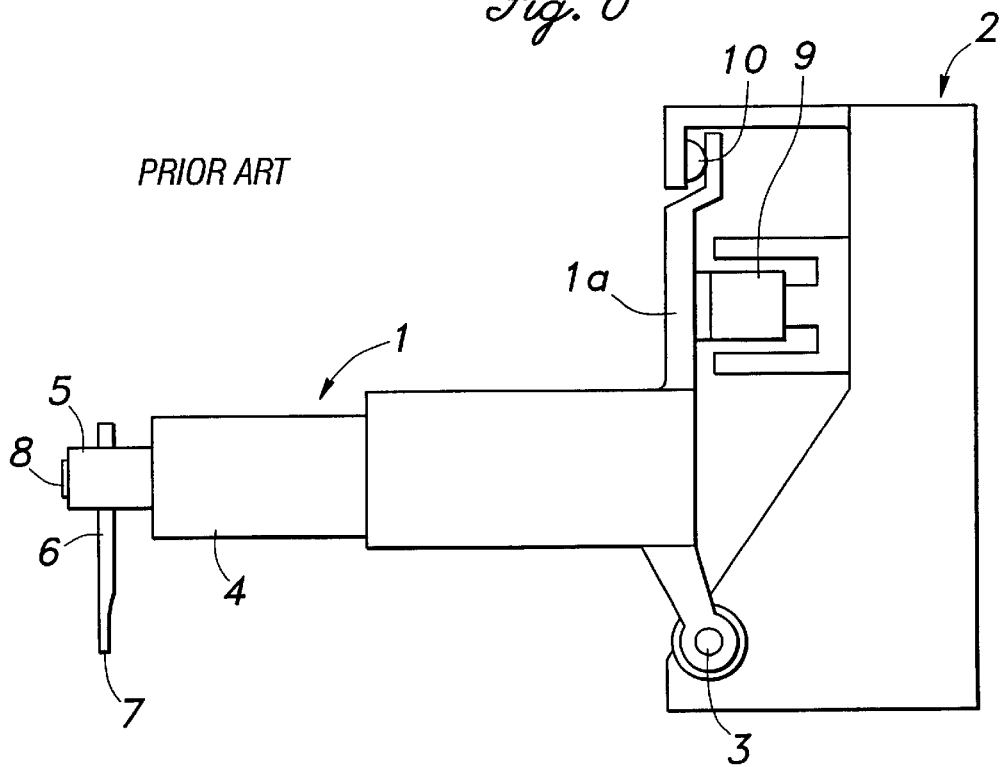
FIG. 6 is a view similar to FIG. 1 showing a conventional arrangement.

Table 1 shows the lateral displacement of the bonding tool tip as the carriage block moves vertically relative to the bonding tool tip for different combinations of the; height h of the fourth pivot with respect to the first pivot, and the distance r between the third and fourth pivots. These values are given as ratios of the actual height and distance relative to one half the distance between the first pivot and the bonding tool tip. The lateral displacement is so small that it is given as a ratio to the actual lateral displacement to that of the prior art arrangement shown in FIG. 6. In this example, height h is positive when the fourth pivot is above the first pivot, and vice versa. Table 1 covers a practical ranges of height h and distance r. The angle of the line extending between the bonding tool tip and the second pivot with respect to the horizontal line is 30 degrees. According to an actual example, the horizontal distance between the bonding tool tip and the third pivot as well as the horizontal distance between the bonding tool tip and the pivot at the base in the prior art arrangement of FIG. 6 was 51.96 mm, the vertical travel of the carriage block relative to the bonding tool tip was 0.045 mm. The relative lateral displacement did not substantially depend on the vertical travel of the carriage block relative to the bonding tool tip or the horizontal distance between the bonding tool tip and the corresponding pivot.

TABLE 1 relative lateral displacement

| | | | | distance between third and fourth pivots (r) | | | | |
|---|---|---|---|---|---|---|---|---|
| | | 0.481 | 0.643 | 0.817 | 1 | 1.191 | 1.389 | 1.592 | 1.8 |
| height of fourth pivot (h) | 0.75 | 1.8 | 1.2 | 0.75 | 0.47 | 0.27 | 0.12 | −0.00 | −0.09 |
| | 0.5 | 1.4 | 0.87 | 0.51 | 0.29 | 0.13 | −0.00 | −0.10 | −0.17 |
| | 0.25 | 1.0 | 0.61 | 0.32 | 0.14 | −0.00 | −0.10 | −0.18 | |
| | 0 | 0.72 | 0.37 | 0.15 | −0.00 | −0.11 | −0.19 | | |
| | −0.25 | 0.44 | 0.17 | −0.00 | −0.12 | −0.20 | | | |
| | −0.5 | 0.20 | −0.00 | −0.13 | −0.21 | | | | |
| | −0.75 | −0.00 | −0.14 | −0.22 | | | | | |

Table 1 shows that the tip skid can be substantially eliminated if the various geometrical relationships are properly selected. This trend substantially holds even when the angle between the line extending between the bonding tool tip and the second pivot and the horizontal line is changed by 15 degrees.

Figure 4:
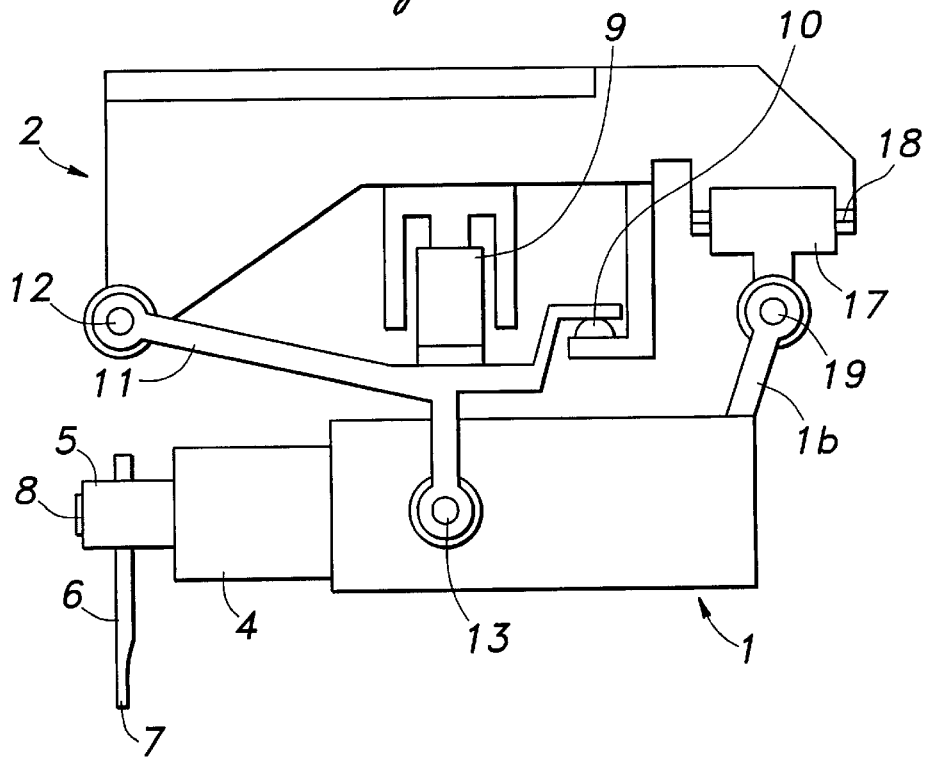
FIG. 4 is a view similar to FIG. 1 showing a second embodiment of the present invention.

FIG. 4 shows a second embodiment of the present invention which is similar to the first embodiment. The parts corresponding to those of the previous embodiment are denoted with like numerals. In this embodiment, a slider 17 is engaged by the carriage block so as to be slidable along a horizontal guide path 18 which is substantially perpendicular to the axial direction of the first and second pivots 12 and 13. An arm 1b extending from the end of the transducer block 1 remote from the bonding tool 6 has a free end which is pivotally connected to the slider 17 via a slider pivot 19 which has a pivot axis extending in parallel with those of the first and second pivots 12 and 13.

This embodiment provides a similar advantage as the previous embodiment. More specifically, as the carriage block 2 continues a descent after the bonding tool tip 7 has landed on the work piece, the movement of the carriage block 2 is accommodated by the rightward sliding movement of the slider 17 or the sliding movement of the slider 17 away from the bonding tool 8, and the resulting pivoting movement of the transducer block 1 allows the bonding tool tip 7 to remain stationary with respect to the work piece. Likewise, as the bonding tool tip 7 descends as a result of the collapsing of the work piece while the carriage block 2 remains stationary, the bonding tool tip 7 is allowed to descend downward along a linear, vertical path because the slider accommodates the leftward movement of the transducer block 1 that is necessary to accomplish The following simple geometrical relationship produces a favorable result. The bonding tool tip has a same lateral position as the first pivot 12, and the first pivot and the slider pivot have a same height. The second pivot is on a mid point of a line extending between the slider pivot and the bonding tool tip, and the distance between the first pivot and the second pivot is one half the distance between the bonding tool tip and the slider pivot.

Table 2 shows the lateral displacement of the bonding tool tip in relation to the deviation of the position of the slider pivot from the height of the first pivot. The deviation of the height of the slider pivot is given as a ratio of the actual height to one half the distance between the first pivot and the bonding tool tip. The value is positive when the slider pivot is above the level of the first pivot, and vice versa. The lateral displacement is so small that it is given as a ratio to the actual lateral displacement to that of the prior art arrangement shown in FIG. 6. In this example, the angle of the line extending between the first and second pivots or the line extending between the bonding tool tip and the second pivot with respect to the horizontal line is 30 degrees, and the horizontal distance between the bonding tool tip and the slider pivot is equal to the horizontal distance between the bonding tool tip and the pivot of the prior art arrangement illustrated in FIG. 6. The relative lateral displacement did not substantially depend on the vertical travel of the carriage block relative to the bonding tool tip or the horizontal distance between the bonding tool tip and the corresponding pivot. According to an actual example, the horizontal distance between the bonding tool tip and the pivot was 51.96 mm, the vertical travel of the carriage block relative to the bonding tool tip was 0.045 mm. In this case, the lateral displacement of the bonding tool tip was 0.02 $\mu$m for the prior art arrangement illustrated in FIG. 6. The vertical travel by 0.045 mm corresponds to an angular displacement of the transducer block by 0.05 degrees, and one half the vertical distance between the first pivot and bonding tool tip was 15 mm.

TABLE 2

| height of slider pivot | relative lateral displacement |
|---|---|
| 0.50 | 0.082 |
| 0.25 | 0.041 |
| 0.00 | 0 |
| −0.25 | −0.041 |
| −0.50 | −0.082 |
| −0.75 | −0.13 |
| −1.00 | −0.17 |
| −1.25 | −0.21 |
| −1.50 | −0.25 |

Table 2 shows that the tip skid can be substantially eliminated if the various geometrical relationships are properly selected. This trend substantially holds even when the angle between the line extending between the bonding tool tip and he second pivot and the horizontal line is changed by 15 degrees.

The geometrical relationship which is used in the forgoing embodiment is called as the Scott-Russel link mechanism, and reference should be made to various textbooks on mechanics for any detailed analysis and variations of this mechanism.

Figure 5:
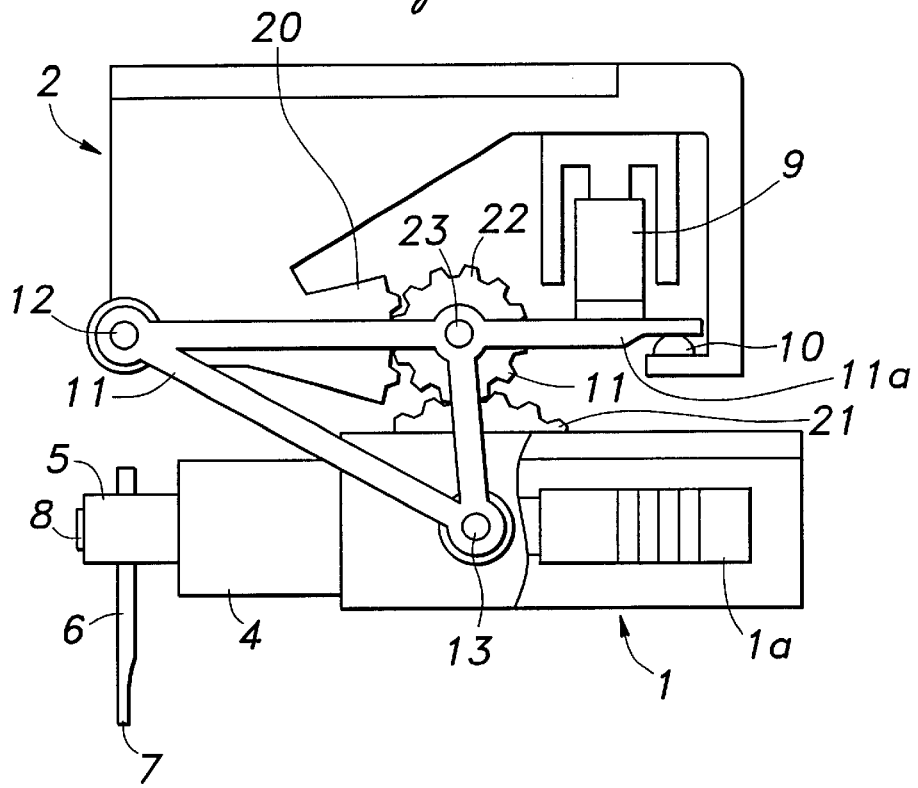
FIG. 5 is a view similar to FIG. 1 showing a third embodiment of the present invention.

FIG. 5 shows a third embodiment of the present invention which is similar to the preceding embodiments. The parts corresponding to those of the previous embodiments are denoted with like numerals. In this embodiment, a spur gear 22 is rotatably supported by an intermediate part of the main link member 11 around a gear pivot 23. The spur gear 22 meshes with a first sector gear 20 which is fixedly attached to the carriage block 2, and a second sector gear 21 which is fixedly attached to the transducer block 1. In this embodiment, the gear pivot and first pivot 23 and 12 are located on a substantially common horizontal line. According to this embodiment, as the main link member 11 pivots around the first pivot 12, the spur gear 22 turns around its pivot 23 (owing to the meshing between the spur gear 22 and first sector gear 20), and the rotation of the spur gear 22 in turn causes a rotation of the transducer block 1 (owing to the meshing between the spur gear 22 and second sector gear 21).

According to this embodiment, the first sector gear 20 has a radius which is twice that of the second sector gear 21. As the main link member 11 turns by angle θ, this causes a rotation of the transducer block 1 by the same angle θ in the same direction around the first pivot 12 assuming that the transducer block 1 remains fixed in relation to the main link member 11. However, owing to the meshing between the two sector gears 20 and 21 and the spur gear 22, the transducer block 1 turns by angle 2θ in the opposite direction around the second pivot 13. These two components of rotation produce the net result of turning the transducer block 1 by the same angle θ as the main link member 11 but in the opposite direction. In other words, as the main link member 11 rotates upward (counter clockwise direction in FIG. 5) with respect to the carriage block 2, the gravitational center of the transducer block 1 moves upward by a corresponding distance while the transducer block 1 turns in the opposite direction (clockwise direction in FIG. 5) by the same rotational angle as the main link member 11 around the pivot 13.

The movement of various parts can be readily visualized by noting the fact that the first pivot 12 and the bonding tool tip 7 are always symmetric with respect to a horizontal line passing through the second pivot shaft 13.

This embodiment provides a similar advantage as the previous embodiments. More specifically, as the carriage block 2 continues descent after the bonding tool tip 7 has landed on the work piece, the main link member 11 pivots around the first pivot 12, and owing to the meshing of the fixed sector gears 20 and 21 and spur gear 22, the transducer block 1 rotates by the same angle as the main link member 11 in the opposite direction. Therefore, the motion of the bonding tool tip 7 can be given as a combination of the arcuate motion of the main link member 11 around the first pivot 12 and an arcuate motion of the bonding tool tip 7 around the second pivot 13. The lateral components of these two arcuate motions cancel each other, and the bonding tool tip 7 moves substantially vertically without any lateral component. The same principle applies to the bonding process so that the transducer block 1 undergoes a linear downward motion as the bonding tool tip 7 descends.

The gears were used in this embodiment to effect the required rotation of the transducer block with respect to the main link member, but it is only exemplary, and a person skilled in the arm can readily appreciate that other modes of power transmission such as V-belts and pulleys, cogged belts and cogged wheels, chains and sprockets, and friction disks can be used for the same purpose instead of using gears.

The wire bonding head according to the present invention can be used in single-point TAE, bonding machines for bonding inner leads of various semiconductor devices and bonding machines for micro BGA devices simply selective appropriate bonding tools. In practice, the bonding machine additionally requires a wire guide mechanism and wire clampers. In wedge bonding machines using wires which are no more than 50 $\mu$m in diameter, various mechanisms for clamping and tearing off the wire to cut the wire, and for feeding the wire under the bonding tool are required. In ball bonding machines, an electric torch may be required to form a ball at the tip of the wire. In wedge bonding machines using wires which are more than 100 $\mu$m in diameter, a cutter may be required to form a notch in the wire. However, these structures are not directly related to the present invention, and are omitted from the description of the present application.

Although the present invention has been described in terms of preferred embodiments thereof, it is obvious to a person skilled in the art that various alterations and modifications are possible without departing from the scope of the present invention which is set forth in the appended claims.

For instance, although the above description was directed to wedge bonding machines for small-diameter wires, the same description substantially applies to other bonding machines using large-diameter wires except for that the various figures may differ. When the wire has a diameter in the order of 500 µm typically, the bonding load is about 10 N, the power input is in the order of tens of W, and the vertical travel of the bonding tool tip is in the order of 0.45 mm. The sizes, travels and masses of various parts would increase accordingly. However, the present invention is equally applicable to such machines having different sizes and different applications.

In particular, the geometric relationships between various parts have been described in more or less precise terms in connection with the foregoing embodiments, but a practical utility of the present invention can be gained without any such precision, and it should be understand that the present invention covers various possible modifications and approximations of the precise relationships actually described in this specification. Also, the pivots in the foregoing description may consist of pivot pins and various other modes of pivotal supports. For instance, pivots using flexures are known to provide play-free, durable pivotal supports, and the pivots as used in the present application should be understood as covering such pivotal supports. Also, pivotal supports which may lack any physical member in the form of a pin are also within the purview of the term "pivot" as used in the present application.

What is claimed is:

1. A wire bonding head, comprising:
   a carriage black adapted to be moved to a desired location over a work piece, and having a first end and a second end which is laterally displaced from said first end;
   a main link member having a first end pivotally attached to said first end of said carriage block via a first pivot having a pivot axis extending substantially horizontally and perpendicularly with respect to a line extending between said first and second ends of said carriage block;
   a transducer block having a first end carrying a bonding tool and a second end which is laterally displaced from said first end of said transducer block, a second end of said main link member being pivotally connected to said transducer block via a second pivot having a pivot axis extending in parallel with said pivot axis of said first pivot;
   an actuator for selectively causing an angular movement to said main link member around said first pivot; and
   a coupling joint connected between said second end of said carriage block and said second end of said transducer block which is constrained so as to create a lateral movement of said second end of said transducer block that is required to move a bonding tool tip vertically and linearly relative to said carriage head as said transducer block is moved relative to said carriage block by said main link member via said second pivot.

2. A wire bonding head according to claim 1, wherein said actuator is interposed between said main link member and said carriage block.

3. A wire bonding head according to claim 2, wherein said actuator comprises a linear motor.

4. A wire bonding head according to claim 1, wherein said coupling joint comprises a substantially vertically extending secondary link member having a first end pivotally connected to said second end of said transducer block via a third pivot, and a second end pivotally connected to said second end of said carriage block via a fourth pivot.

5. A wire bonding head according to claim 4, wherein said first pivot and bonding tool tip are located at a substantially same lateral position.

6. A wire bonding head according to claim 4, wherein said first and fourth pivots are located at a substantially same height.

7. A wire bonding head according to claim 1, wherein said coupling joint comprises a slider guided horizontally along said second end of said carriage block, and an arm extending from said second end of said transducer block and having a free end pivotally attached to said slider via a slider pivot.

8. A wire bonding head according to claim 7, wherein said slider pivot is located at a substantially same height as said first pivot.

9. A wire bonding head according to claim 1, wherein said second pivot has a pivot axis passing substantially through a gravitational center of said transducer block.

10. A wire bonding head, comprising:
    a carriage block adapted to be moved to a desired location over a work piece, and having a first end and a second end which is laterally displaced from said first end;
    a main link member having a first end pivotally attached to said first end of said carriage block via a first pivot having a pivot axis extending substantially horizontally and perpendicularly with respect to a line extending between said first and second ends of said carriage block;
    a transducer block having a first end carrying a bonding tool and a second end which is laterally displaced from said first end of said transducer block, a second end of said main link member being pivotally connected to said transducer block via a second pivot having a pivot axis extending in parallel with said pivot axis of said first pivot;
    an actuator for selectively causing an angular movement to said main link member around said first pivot; and
    a coupling joint connected between said carriage block, said main link member and said transducer block, said coupling joint being constrained so as to cause a rotation of said transducer block by a substantially same but opposite rotational angle as that of said main link member with respect to said carriage block.

11. A wire bonding head according to claim 10, wherein said actuator is interposed between said main link member and said carriage block.

12. A wire bonding head according to claim 11, wherein said actuator comprises a linear motor.

13. A wire bonding head according to claim 11, wherein said coupling joint comprises a pair of fixed gears fixedly attached to said transducer block and carriage block, respectively, and a third gear rotatably supported by said main link member and meshing with both of said fixed gears, the gear fixed to the carriage block having a radius twice that of the gear fixed to the transducer block.

14. A wire bonding head according to claim 13, wherein said first pivot and bonding tool tip are located symmetric with respect to a horizontal line passing through said second pivot.

15. A wire bonding head according to claim 10, wherein said first pivot and bonding tool tip are located at a substantially same lateral position.

16. A wire bonding head according to claim 10, wherein said second pivot has a pivot axis passing substantially through a gravitational center of said transducer block.

* * * * *